(12) United States Patent
Xu et al.

(10) Patent No.: US 8,445,890 B2
(45) Date of Patent: May 21, 2013

(54) SOLID STATE LIGHTING DEVICES GROWN ON SEMI-POLAR FACETS AND ASSOCIATED METHODS OF MANUFACTURING

(75) Inventors: Lifang Xu, Boise, ID (US); Zaiyuan Ren, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 212 days.

(21) Appl. No.: 12/720,440

(22) Filed: Mar. 9, 2010

(65) Prior Publication Data
US 2011/0220866 A1 Sep. 15, 2011

(51) Int. Cl.
*H01L 33/00* (2010.01)

(52) U.S. Cl.
USPC ........... 257/14; 257/94; 257/E33.003; 438/47

(58) Field of Classification Search
None
See application file for complete search history.

(56) References Cited

U.S. PATENT DOCUMENTS

| | | | |
|---|---|---|---|
| 6,734,030 B2 * | 5/2004 | Doi et al. | 438/22 |
| 6,828,591 B2 * | 12/2004 | Okuyama et al. | 257/89 |
| 7,790,584 B2 * | 9/2010 | Paek et al. | 438/507 |
| 8,022,427 B2 * | 9/2011 | Miyake et al. | 257/98 |
| 2007/0077674 A1 * | 4/2007 | Okuyama et al. | 438/48 |
| 2007/0218703 A1 | 9/2007 | Kaeding et al. | |
| 2008/0179607 A1 | 7/2008 | DenBaars et al. | |
| 2008/0283854 A1 | 11/2008 | Iza et al. | |
| 2009/0078944 A1 * | 3/2009 | Kubota et al. | 257/88 |
| 2009/0095973 A1 | 4/2009 | Tanaka et al. | |
| 2009/0197118 A1 * | 8/2009 | Nagai et al. | 428/698 |
| 2009/0250686 A1 | 10/2009 | Sato et al. | |
| 2010/0219416 A1 * | 9/2010 | Farrell et al. | 257/76 |
| 2011/0020602 A1 * | 1/2011 | Schlesser et al. | 428/141 |
| 2011/0179993 A1 * | 7/2011 | Inoue et al. | 117/94 |

FOREIGN PATENT DOCUMENTS

JP 08255929 A * 10/1996

OTHER PUBLICATIONS

Okamoto, Kuniyoshi, Taketoshi Tanaka, Masashi Kubota, and Hiroaki Ohta. "Pure Blue Laser Diodes Based on Nonpolar—Plane Gallium Nitride with InGaN Waveguiding Layers." Japanese Journal of Applied Physics 46.No. 35 (2007): L820-822.*

Okamoto, Kuniyoshi, Hiroaki Ohta, Daisuke Nakagawa, Masayuki Sonobe, Jun Ichihara, and Hidemi Takasu. "Dislocation-Free—Plane InGaN/GaN Light-Emitting Diodes on—Plane GaN Single Crystals." Japanese Journal of Applied Physics 45.No. 45 (2006): L1197-1199.*

Chen, X.j., J.s. Hwang, G. Perillat-Merceroz, S. Landis, B. Martin, D. Le Si Dang, J. Eymery, and C. Durand. "Wafer-scale Selective Area Growth of GaN Hexagonal Prismatic Nanostructures on C-sapphire Substrate." Journal of Crystal Growth (2011).*

(Continued)

*Primary Examiner* — Thomas L Dickey
*Assistant Examiner* — Joseph Schoenholtz
(74) *Attorney, Agent, or Firm* — Perkins Coie LLP

(57) ABSTRACT

Solid state lighting devices grown on semi-polar facets and associated methods of manufacturing are disclosed herein. In one embodiment, a solid state light device includes a light emitting diode with an N-type gallium nitride ("GaN") material, a P-type GaN material spaced apart from the N-type GaN material, and an indium gallium nitride ("InGaN")/GaN multi quantum well ("MQW") active region directly between the N-type GaN material and the P-type GaN material. At least one of the N-type GaN, InGaN/GaN MQW, and P-type GaN materials is grown a semi-polar sidewall.

28 Claims, 8 Drawing Sheets

OTHER PUBLICATIONS

Okada, Narihito. "Direct Growth of M-plane GaN with Epitaxial Lateral Overgrowth from C-plane Sidewall of A-plane Sapphire." Applied Physics Express 1.111101 (2008): 11101-1-11101-3.*

Craven, M. D., F. Wu, a. Chakraborty, B. Imer, U. K. Mishra, S. P. DenBaars, and J. S. Speck. "Microstructural Evolution of Aplane GaN Grown on A-plane SiC by Metalorganic Chemical Vapor Deposition." Applied Physics Letters 84.8 (2004): 1281.*

Chiu, C. H., H. H. Yen, C. L. Chao, Z. Y. Li, Peichen Yu, H. C. Kuo, T. C. Lu, S. C. Wang, K. M. Lau, and S. J. Cheng. "Nanoscale Epitaxial Lateral Overgrowth of GaN-based Light-emitting Diodes on a $SiO_2$ Nanorod-array Patterned Sapphire Template." Applied Physics Letters 93.8 (2008).*

Fini, P., and H. Marchand. "Determination of Tilt in the Lateral Epitaxial Overgrowth of GaN Using X-ray Di!raction." Journal of Crystal Growth 209 (2000): 581-90.*

Gibart, Pierre. "Metal Organic Vapour Phase Epitaxy of GaN and Lateral Overgrowth." Reports on Progress in Physics 67.5 (2004): 667-715.*

Nam, Ok-Hyun, Tsvetanka S. Zheleva, Michael D. Bremser, and Robert F. Davis. "Lateral Epitaxial Overgrowth of GaN Films on S102 Areas via Metalorganic Vapor Phase Epitaxy." Journal of Electronic Materials 27.4 (1998): 233-37.*

Imer, Bilge M., Feng Wu, Steven P. DenBaars, and James S. Speck. "Improved Quality (1120) a-plane GaN with Sidewall Lateral Epitaxial Overgrowth." Applied Physics Letters 88.6 (2006): 061908.*

MAT 215C / ECE 220C Semiconductor Device Processing, Lecture 2, Nakumura, University of California, Santa Barabara, 2011 http://www.ece.ucsb.edu/courses/ECE220/220C_S11Nakamura/default.html.*

Razeghi, M., P. Sandvik, P. Kung, D. Walker, K. Mi, X. Zhang, V. Kumar, J. Diaz, and F. Shahedipour. "Lateral Epitaxial Overgrowth of GaN on Sapphire and Silicon Substrates for Ultraviolet Photodetector Applications." Materials Science and Engineering B 74.1-3 (2000): 107-12.*

Sun, Y.Q. "High Quality A-plane GaN Films Grown on Cone-shaped Patterned R-plane." Thin Solid Films (2011): 2508-512.*

Growth and characterization of a-plane InGaN/GaN multiple quantum well LEDs grown on r-plane sapphire Keun Man Song et al 2012 Semicond. Sci. Technol. 27 015011.*

Huang, Hung-Hsun, and Yuh-Renn Wu. "Light Emission Polarization Properties of Semipolar InGaN/GaN Quantum Well." Journal of Applied Physics 107.5 (2010): 053112.*

Masui, Hisashi, Hirokuni Asamizu, Anurag Tyagi, Natalie Fellows DeMille, Shuji Nakamura, and Steven P. DenBaars. "Correlation between Optical Polarization and Luminescence Morphology of (11-22)-Oriented InGaN/GaN Quantum-Well Structures." Applied Physics Express 2 (2009): 071002.*

Fellows, Natalie, Hitoshi Sato, Hisashi Masui, Steven P. DenBaars, and Shuji Nakamura. "Increased Polarization Ratio on Semipolar (11-22) InGaN/GaN Light-Emitting Diodes with Increasing Indium Composition." Japanese Journal of Applied Physics 47.No. 10 (2008): 7854-856.*

Tyagi, Anurag, You-Da Lin, Daniel A. Cohen, Makoto Saito, Kenji Fujito, James S. Speck, Steven P. DenBaars, and Shuji Nakamura. "Stimulated Emission at Blue-Green (480 Nm) and Green (514 Nm) Wavelengths from Nonpolar (-plane) and Semipolar (11-22) InGaN Multiple Quantum Well Laser Diode Structures." Applied Physics Express 1 (2008): 091103.*

Zhong, H., A. Tyagi, N. N. Fellows, R.B. Chung, M. Saito, K. Fujito, J.S. Speck, S.P. DenBaars, and S. Nakamura. "Demonstration of High Power Blue-green Light Emitting Diode on Semipolar (1122) Bulk GaN Substrate." Electronics Letters 43.15 (2007): 825.*

Schwarz, U.T. et al., Nitride emitters go nonpolar, Phys. Stat. Sol. (RRL) 1 (2007) A44-A46.

Cheong, H.S. et al., Direct heteroepitaxial lateral overgrowth of GaN on stripe-patterned sapphire substrates with very thin $SiO_2$ masks, Phys. Stat. Sol. (b) 241 (2004) 2763-2766.

Feezell, D.F. et al., Development of Nonpolar and Semipolar InGaN/GaN Visible Light-Emitting Diodes, MRS Bulletin, vol. 34, pp. 318-323, May 2009.

* cited by examiner

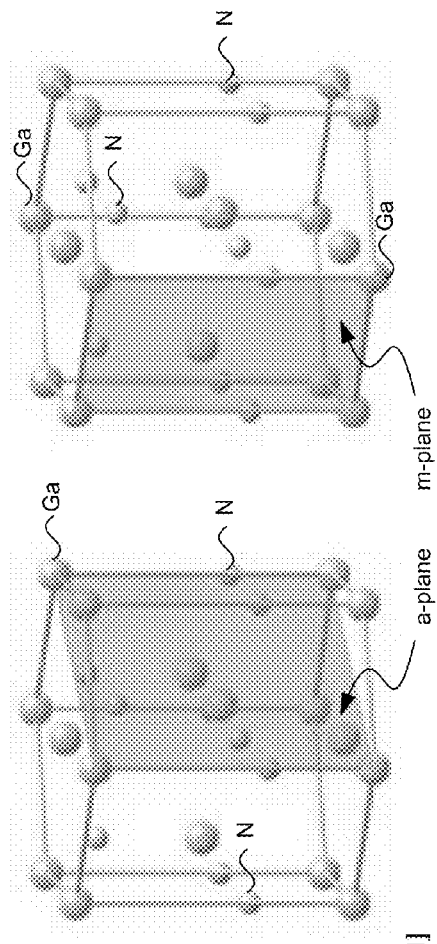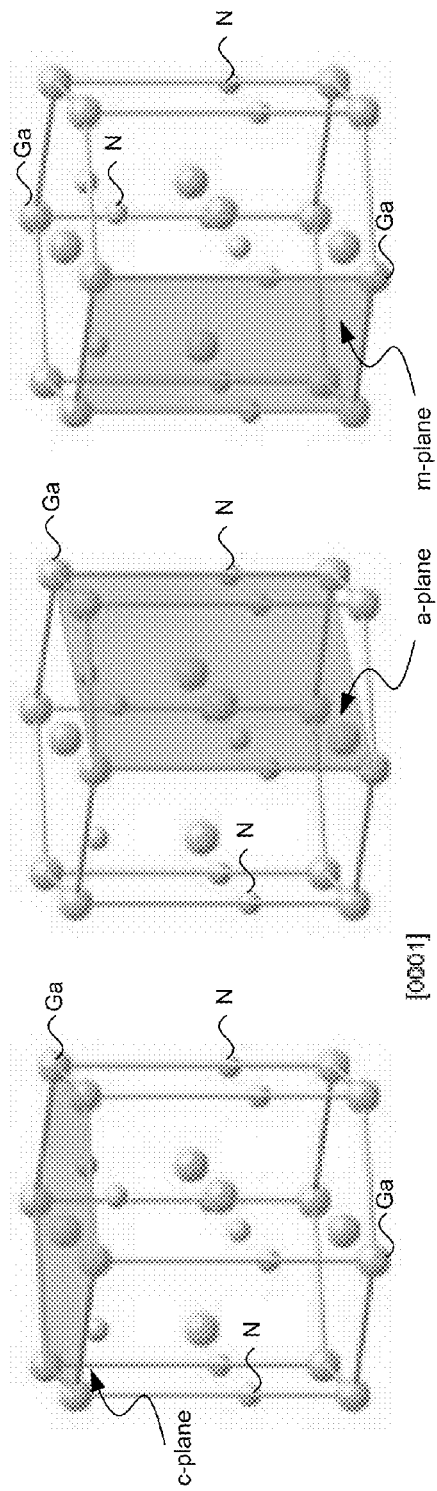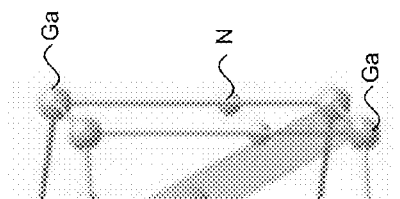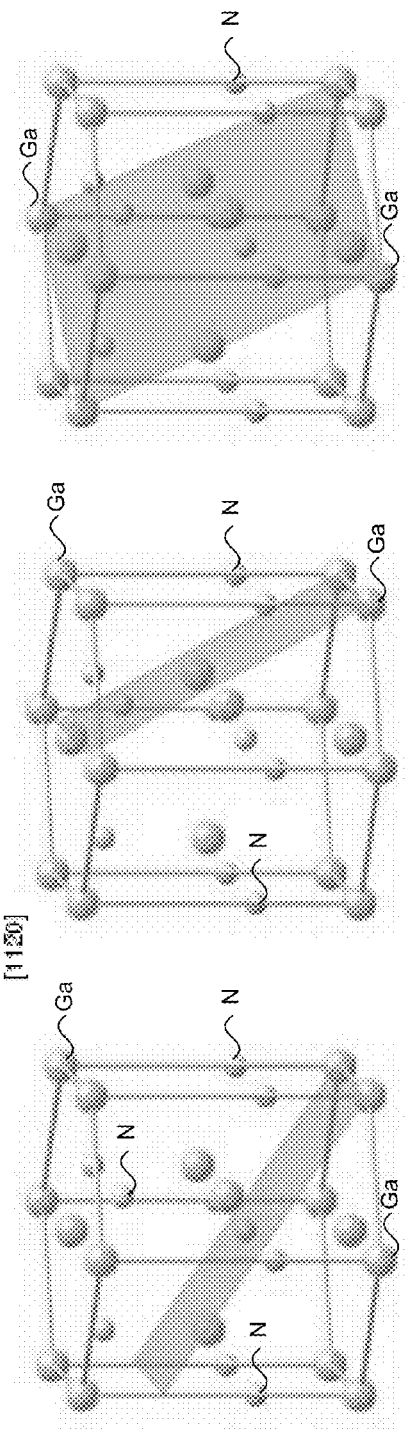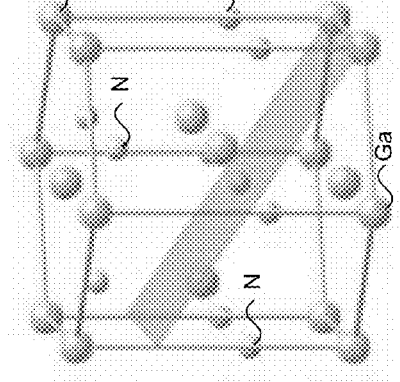
FIG. 2A  FIG. 2B  FIG. 2C  FIG. 2D  FIG. 2E  FIG. 2F

SOLID STATE LIGHTING DEVICES GROWN ON SEMI-POLAR FACETS AND ASSOCIATED METHODS OF MANUFACTURING

TECHNICAL FIELD

The present technology is directed generally to solid state lighting (SSL) devices grown on semi-polar facets and associated methods of manufacturing.

BACKGROUND

SSL devices generally use semiconductor light emitting diodes (LEDs), organic light-emitting diodes ("OLEDs"), and/or polymer light emitting diodes ("PLEDs") as sources of illumination rather than electrical filaments, a plasma, or a gas. FIG. 1 is a cross-sectional diagram of a portion of a conventional indium-gallium nitride ("InGaN") LED 10. As shown in FIG. 1, the LED 10 includes a substrate 12 (e.g., silicon carbide, sapphire, gallium nitride, or silicon), an N-type gallium nitride (GaN) material 14, an InGaN/GaN multi quantum well (MQW) 16, and a P-type GaN material 18 on one another in series. The LED 10 also includes a first contact 20 on the P-type GaN material 18 and a second contact 22 on the N-type GaN material 14.

The GaN/InGaN materials 14, 16, and 18 have a wurtzite crystal formation in which hexagonal rings of gallium (or indium) are stacked on top of hexagonal rings of nitrogen atoms. According to conventional techniques, the GaN/InGaN materials 14, 16 and 18 are typically grown along a direction generally perpendicular to the hexagonal rings of gallium (or indium) and nitrogen atoms. As discussed in more detail later, the growth direction of the GaN/InGaN materials 14, 16 and 18 may negatively impact the optical efficiency of the LED 10. Accordingly, several improvements in the optical efficiency of LEDs may be desirable.

BRIEF DESCRIPTION OF THE DRAWINGS

FIGS. 2A-2F are schematic perspective views of various crystal planes in a GaN/InGaN material in accordance with embodiments of the technology.

DETAILED DESCRIPTION

Figure 1:
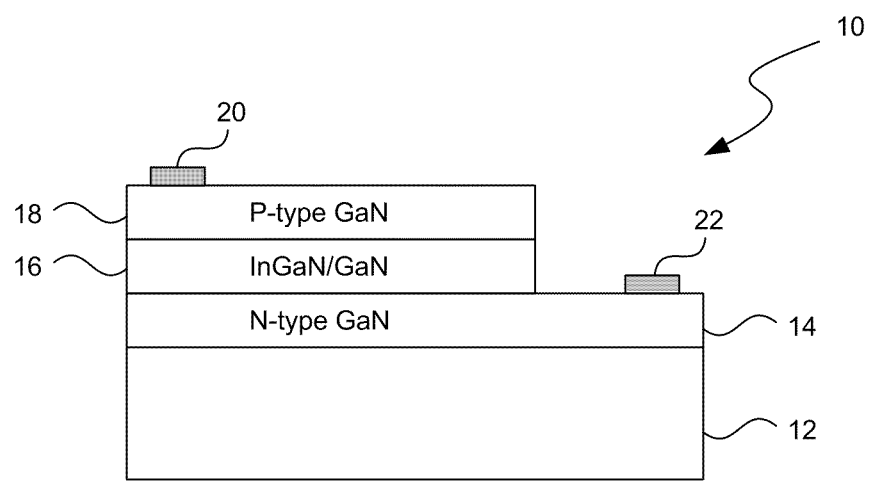
FIG. 1 is a cross-sectional view of a portion of an LED in accordance with the prior art.

Various embodiments of SSL devices and associated methods of manufacturing are described below. The term "microelectronic substrate" is used throughout to include substrates upon which and/or in which SSL devices, microelectronic devices, micromechanical devices, data storage elements, read/write components, and other features are fabricated. The term "optical efficiency" is defined as a percentage of photon output per unit electron input. A person skilled in the relevant art will also understand that the technology may have additional embodiments, and that the technology may be practiced without several of the details of the embodiments described below with reference to FIGS. 2A-5B.

In the following discussion, an LED having GaN/InGaN materials is used as an example of an SSL device in accordance with embodiments of the technology. Several embodiments of the SSL device may also include at least one of gallium arsenide (GaAs), aluminum gallium arsenide (AlGaAs), gallium arsenide phosphide (GaAsP), aluminum gallium indium phosphide (AlGaInP), gallium(III) phosphide (GaP), zinc selenide (ZnSe), boron nitride (BN), aluminum nitride (AlN), aluminum gallium nitride (AlGaN), aluminum gallium indium nitride (AlGaInN), and/or other suitable semiconductor materials. The foregoing semiconductor materials may have generally similar or different crystal structures than GaN/InGaN materials. However, the following definition of polar, non-polar, and semi-polar planes may still apply.

FIGS. 2A-2F are schematic perspective views of various crystal planes in a portion of a GaN/InGaN material. In FIGS. 2A-2F, Ga (or Ga/In) and N atoms are schematically shown as large and small spheres, respectively. As shown in FIGS. 2A-2F, the GaN/InGaN material has a wurtzite crystal structure with various lattice planes or facets as represented by corresponding Miller indices. A discussion of the Miller index can be found in the *Handbook of Semiconductor Silicon Technology* by William C. O'Mara.

As used hereinafter, a "polar plane" generally refers to a crystal plane in a crystal structure that contains only one type of atoms. For example, as shown in FIG. 2A, the polar plane denoted as the "c-plane" in the wurtzite crystal structure with a Miller index of (0001) contains only Ga atoms. Similarly, other polar planes in the wurtzite crystal structure may contain only N atoms and/or other suitable type of atoms.

As used hereinafter, a "non-polar plane" generally refers to a crystal plane in a crystal structure that is generally perpendicular to a polar plane (e.g., to the c-plane). For example, FIG. 2B shows a non-polar plane denoted as the "a-plane" in the wurtzite crystal structure with a Miller index of (11$\bar{2}$0). FIG. 2C shows another non-polar plane denoted as the "m-plane" in the wurtzite crystal structure with a Miller index of (10$\bar{1}$0). Both the a-plane and the m-plane are generally perpendicular to the c-plane shown in FIG. 2A.

As used hereinafter, a "semi-polar plane" generally refers to a crystal plane in a crystal structure that is canted relative to a polar plane (e.g., to the c-plane) without being perpendicular to the polar plane. For example, as shown in FIGS. 2D-2F, each of the semi-polar planes in the wurtzite crystal structure with Miller indices of (10$\bar{1}$3), (10$\bar{1}$1), and (11$\bar{2}$2) form an angle with the c-plane shown in FIG. 2A. The angle is greater than 0° but less than 90°. Even though only particular examples of crystal planes are illustrated in FIGS. 2A-2F, each of the polar, non-polar, and semi-polar planes can also include other crystal planes not illustrated in FIGS. 2A-2F.

Figure 3A:
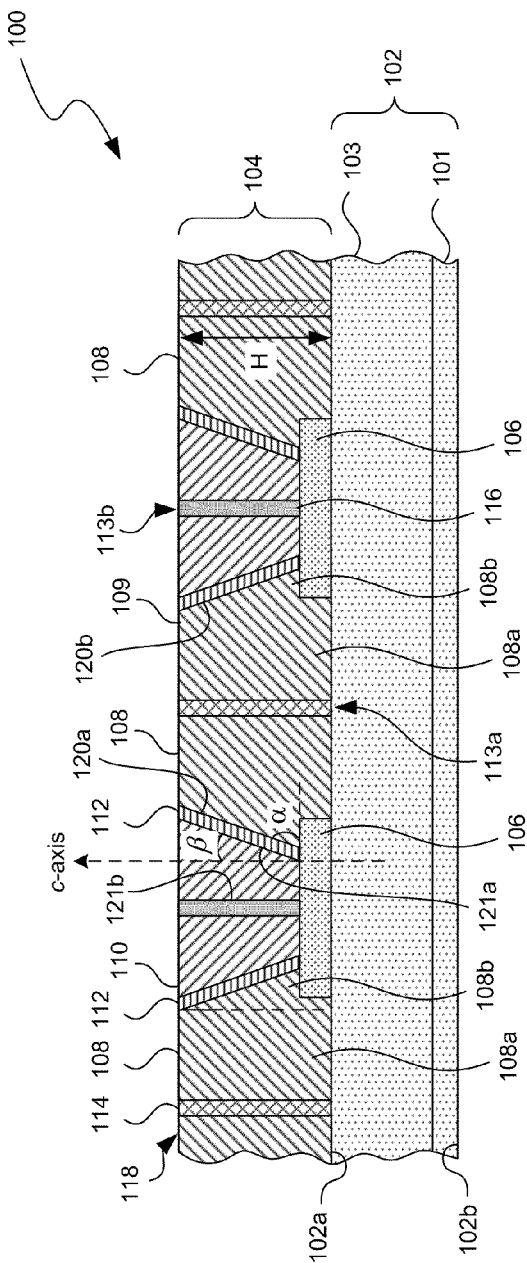
FIG. 3A is a cross-sectional view of a portion of an SSL device in accordance with embodiments of the technology.
Figure 3B:
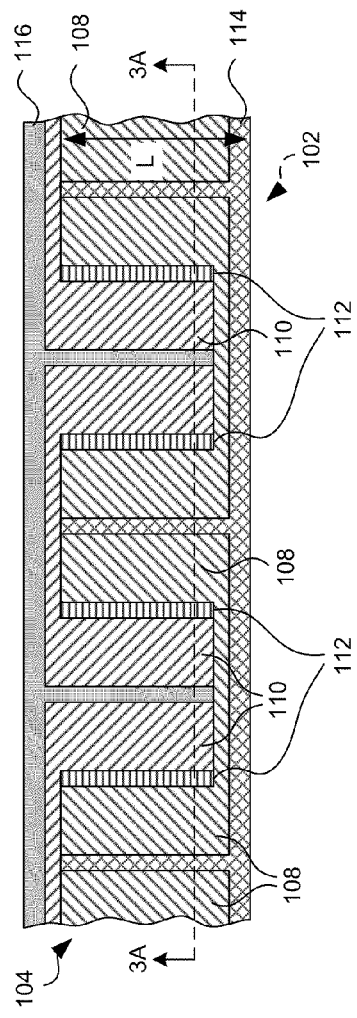
FIG. 3B is a top view of a portion of the SSL device in FIG. 3A in accordance with embodiments of the technology.

FIG. 3A is a cross-sectional view and FIG. 3B is a top view of a portion of an SSL device 100 in accordance with embodiments of the technology. Referring to FIG. 3A, the SSL device 100 includes a microelectronic substrate 102 carrying an LED structure 104. The microelectronic substrate 102 includes a first surface 102a proximate to the LED structure 104 and a second surface 102b opposite the first surface 102a. Even though not shown in FIG. 3A, other embodiments of the SSL device 100 can also include a buffer material, a mirror material, a support structure, interconnects, and/or other suitable mechanical/electrical components (not shown).

In the illustrated embodiment, the microelectronic substrate 102 includes an optional support material 103 on a substrate material 101. In certain embodiments, the support material 103 and the substrate material 101 include the same composition (e.g., GaN). In other embodiments, the support material 103 and the substrate material 101 can include different materials. For example, the support material 103 can include a GaN material, and the substrate material 101 can include silicon (Si), silicon carbide (SiC), sapphire ($Al_2O_3$), a combination of the foregoing materials and/or other suitable substrate materials. In further embodiments, the substrate material 101 may be omitted.

Referring to FIGS. 3A and 3B together, the LED structure 104 includes a plurality of foundations 106 (FIG. 3A) and a first semiconductor material 108 both on the first surface 102a of the microelectronic substrate 102, a second semiconductor material 110 spaced laterally apart from the first semiconductor material 108, and an active region 112 between the first and second semiconductor materials 108 and 110. The LED structure 104 can also include a first contact 114 in the first semiconductor material 108 and a second contact 116 in the second semiconductor material 110.

In the illustrated embodiment, the first and second semiconductor materials 108 and 110, the active region 112, the first contact 114, and the second contact 116 form an LED surface 118 (FIG. 3B) that is generally planar and parallel to the first surface 102a of the microelectronic substrate 102. In other embodiments, the LED surface 118 may be generally planar but slanted relative to the first surface 102a of the microelectronic substrate 102. In further embodiments, the LED surface 118 may be non-planar. In yet further embodiments, the LED surface 118 may have other suitable configurations.

In the embodiment shown in FIG. 3A, the foundations 106 individually include a generally cuboid shape extending along a direction with a Miller index of ($10\bar{1}1$) relative to the support material 103. In other embodiments, the foundations 106 can also have a quadrilateral frustum, cubic, pentagonal, parallelepiped, rhombohedron, and/or other suitable shapes. The foundations 106 may also extend along other desired directions relative to the support material 103. In certain embodiments, the foundations 106 may include the same material as the microelectronic substrate 102. In other embodiments, the foundations 106 may include a material different from the microelectronic substrate 102. Suitable materials of the foundations 106 can include silicon oxide ($SiO_2$), silicon nitride (SiN), aluminum nitride (AlN), GaN, and/or other semiconductor materials.

Referring to FIG. 3A, the first semiconductor material 108 and the second semiconductor material 110 can extend from the first surface 102a along a direction generally parallel to a polar axis (denoted as the c-axis). In the illustrated embodiment, the first semiconductor material 108 includes an N-type GaN material with a first portion 108a adjacent to a second portion 108b, as indicated by a phantom line in FIG. 3A. The first portion 108a extends between the LED surface 118 and the first surface 102a of the microelectronic substrate 102. The second portion 108b is defined by the foundation 106, the active region 112, and the first portion 108a. In other embodiments, the first and second portions 108a and 108b of the first semiconductor material 108 may have other relative positions and/or suitable configurations.

As shown in FIG. 3A, the first semiconductor material 108 includes a semiconductor surface 109 and a plurality of sidewalls 120 (identified individually as a first sidewall 120a and a second sidewall 120b for illustration purposes) between the semiconductor surface 109 and the first surface 102a of the microelectronic substrate 102. The sidewalls 120 can extend along semi-polar planes of the first semiconductor material 108. For example, in the illustrated embodiment, the first sidewall 120a extends along a semi-polar plane with a Miller index of ($10\bar{1}1$). The second sidewall 120b extends along another semi-polar plane with a Miller index of ($11\bar{2}2$). In other embodiments, the sidewalls 120 can also extend along other suitable semi-polar planes of the first semiconductor material 108.

The second semiconductor material 110 includes a P-type GaN material that extends between the LED surface 118 and the foundation 106. As shown in FIG. 3A, the second semiconductor material 110 can have a first sidewall 121a and a second sidewall 121b. The first sidewall 121a can be generally parallel to the first sidewall 120a of the first semiconductor material 108. The second sidewall 121b can be generally parallel to the c-axis. In other embodiments, the second semiconductor material 110 may have other suitable cross sections and/or configurations.

The active region 112 can be formed on a semi-polar plane of the first semiconductor material 108. For example, as shown in FIG. 3A, the active region 112 includes an InGaN material on the first semi-polar sidewall 120a with a Miller index of ($10\bar{1}1$) and the second semi-polar sidewall 120b with a Miller index of ($11\bar{2}2$) of the first semiconductor material 108. As a result, the active region 112 can form an angle $\alpha$ of about 58° relative to the first surface 102a of the microelectronic substrate 102 (or an angle $\beta$ of about 32° relative to the c-axis). In other embodiments, the active region 112 may also include other suitable LED materials on other suitable semi-polar planes of the first and/or second semiconductor materials 108 and 110.

As shown FIGS. 3A and 3B, the first and second contacts 114 and 116 can include a conductive material (e.g., copper, aluminum, gold, etc.) in a first slot 113a (FIG. 3A) and a second slot 113b (FIG. 3A) in the first and second semiconductor materials 108 and 110, respectively. In the illustrated embodiment, the first and second contacts 114 and 116 have a length L and a height H approximately equal to those of the first and second semiconductor materials 108 and 110, respectively. For example, the first contact 114 extends completely between the semiconductor surface 109 of the first semiconductor material 108 and the first surface 102a of the microelectronic substrate 102. In other embodiments, the first and second contacts 114 and 116 can have other dimensions and/or configurations.

Figure 3C:
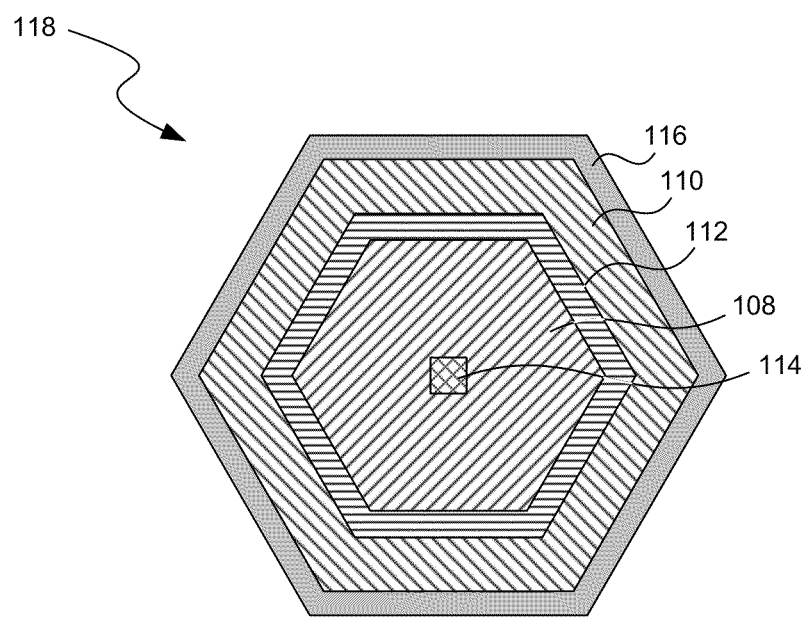
FIG. 3C is a top view of a portion of the SSL device in FIG. 3A in accordance with additional embodiments of the technology.

Even though the first semiconductor material 108, the second semiconductor material 110, and the active region 112 are shown in FIGS. 3A and 3B as being generally parallel to one another at the LED surface 118, other embodiments of these components may have other shapes and/or configurations. For example, FIG. 3C is a top view of a portion of the SSL device 100 in FIG. 3A in accordance with additional embodiments of the technology. As shown in FIG. 3C, the first semiconductor material 108, the second semiconductor material 110, the active region 112, and the second contact 116 are generally concentric, and each individually has a hexagonal shape. The first contact 114 is located in a central region of the first semiconductor material 108. In other embodiments, at least some of the foregoing components may have a circular, rectangular, trapezoidal, and/or other suitable shapes.

Several embodiments of the SSL device 100 may have an increased optical efficiency compared to conventional LEDs. According to conventional techniques, the active region of an LED is typically grown along the c-axis (FIG. 3A), i.e., on polar planes of one of the first and second semiconductor materials 108 and 110. Without being bound by theory, it is believed that the GaN/InGaN materials grown along the c-axis are polarized with an induced internal electric field generally perpendicular to the direction of growth. It is also believed that the internal electric field can slant the energy bands of the active region and can spatially prevent some of the electrons in the N-type GaN material from recombining with holes in the P-type GaN material during operation. The low recombination rate can result in a low optical efficiency of the LED. As a result, by forming the active region 112 on a semi-polar plane of the first or second semiconductor material 108 or 110, the induced internal electric field can be reduced. Thus, the recombination rate in the SSL device 100 may be increased to improve the optical efficiency of the SSL device 100.

Several embodiments of the SSL device 100 may also have a reduced contact resistance and improved current spread through the active region 112 when compared to conventional LEDs. For example, as shown in FIG. 3A, the first and second contacts 114 and 116 are in physical contact with the entire sidewalls substantially of the first and second semiconductor materials 108 and 110, respectively. As a result, the contact area between the first (or second) contact 114 (or 116) and the first (or second) semiconductor material 108 (or 110) may be increased compared to the contact points shown in FIG. 1. The increased contact area can thus reduce the electric resistance between the first (or second) contact 114 (or 116) and the first (or second) semiconductor material 108 (or 110) and improve the current spread through the active region 112.

Several embodiments of the SSL device 100 may further have improved light extraction efficiency when compared to conventional LEDs. As used hereinafter, the light extraction efficiency generally refers to a percentage of photons extracted from an SSL device per unit photon generated internally by the SSL device. Without being bound by theory, it is believed that the N-type and P-type GaN materials 14 and 18 (FIG. 1) and the InGaN/GaN MQW 16 (FIG. 1) of the LED 10 (FIG. 1) have different indices of refraction, which may result in at least partially internal reflection. For example, when a light strikes the surface between the GaN materials 14 and 18 and InGaN/GaN MQW 16 at an angle greater than the critical angle defined by the indices of refraction, internal reflection occurs. Thus, at least a portion of the generated light may be trapped in the InGaN/GaN MQW 16 and fails to be extracted. It is believed that the canted active region 112 can enable more light to be extracted by increasing the critical angle of internal reflection.

Even though the first and second semiconductor materials 108 and 110 are described above as including an N-type GaN material and a P-type GaN material, respectively, in other embodiments the second semiconductor material 110 can include an N-type GaN material and the first semiconductor material 108 can include a P-type material. In further embodiments, at least one of the first and second semiconductor materials 108 and 110 can include other suitable cladding materials.

Figure 4A:
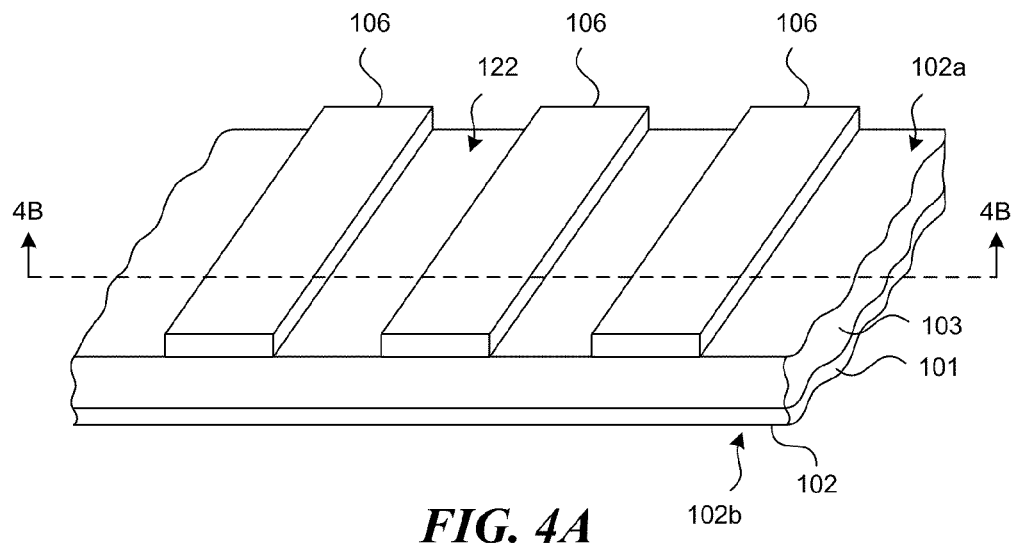
FIGS. 4A-4E are perspective and cross-sectional views of a portion of a microelectronic substrate undergoing a process of forming the SSL device in FIGS. 3A and 3C in accordance with embodiments of the technology.
Figure 4B:
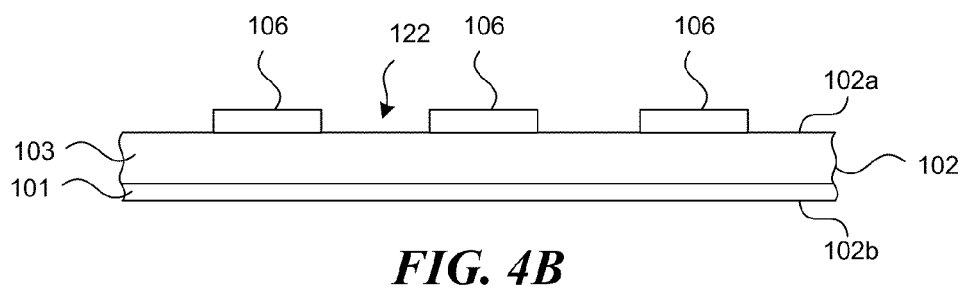

FIGS. 4A-4E are perspective and cross-sectional views of a portion of a microelectronic substrate undergoing a process of forming the SSL device 100 in FIGS. 3A and 3B in accordance with embodiments of the technology. As shown in FIGS. 4A and 4B, an optional initial stage of the process can include forming the support material 103 on the substrate material 101 of the microelectronic substrate 102. In one embodiment, forming the support material 103 includes forming a GaN material with a thickness of, for example, one micron on the substrate material 101. In other embodiments, the support material 103 may include a GaN material with other desired thicknesses and/or may include a different material. Techniques for forming the GaN material can include metal organic CVD ("MOCVD"), molecular beam epitaxy ("MBE"), liquid phase epitaxy ("LPE"), hydride vapor phase epitaxy ("HVPE"), and/or other suitable techniques.

The process can then include forming the foundations 106 on the microelectronic substrate 102. In one embodiment, the foundations 106 include a plurality of silicon oxide ("$SiO_2$") cuboid slabs spaced apart from one another by an open region 122. In one embodiment, forming the plurality of $SiO_2$ slabs can include depositing a photoresist (not shown) on the microelectronic substrate 102, patterning the photoresist to define the openings generally corresponding to the slabs, and depositing $SiO_2$ through the openings via chemical vapor deposition ("CVD"), atomic layer deposition ("ALD"), and/or other suitable techniques. In another embodiment, forming the plurality of $SiO_2$ slabs can include blanket depositing $SiO_2$ material on the first surface 102a, patterning the deposited $SiO_2$ material with a photoresist (not shown), and removing portions of the $SiO_2$ material to form the foundations 106. In further embodiments, the foundations 106 may be formed via other suitable techniques.

Figure 4C:
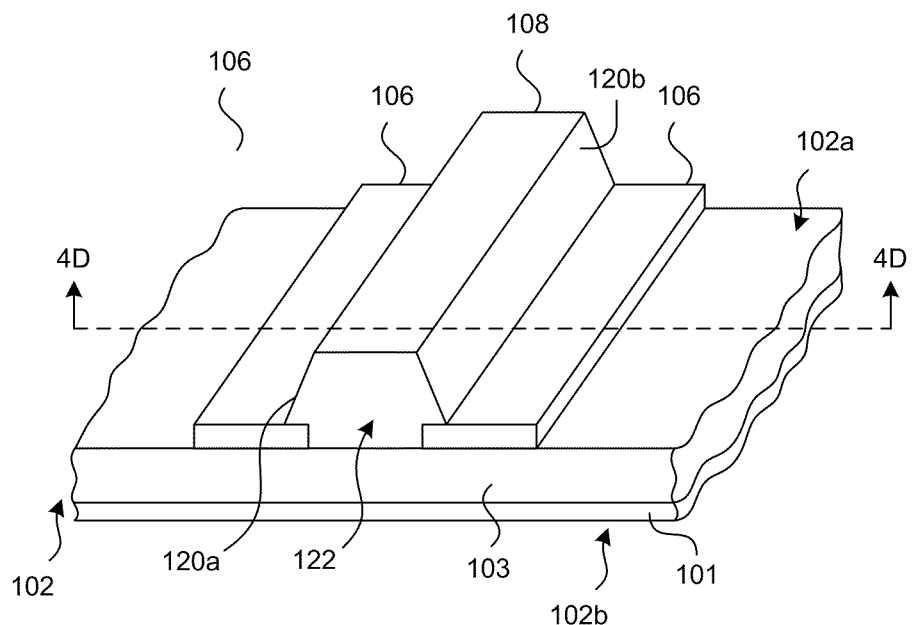
Figure 4D:
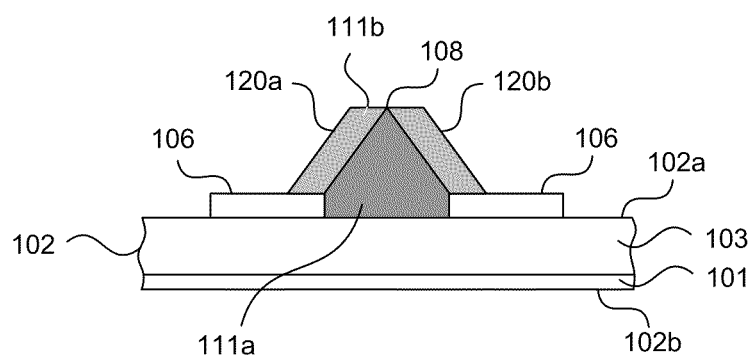

As shown in FIGS. 4C and 4D, the process includes forming the first semiconductor material 108 on a portion of the foundations 106 and the first surface 102a of the microelectronic substrate 102. In one embodiment, forming the first semiconductor material 108 includes depositing an N-type GaN material on the foundations 106 and the microelectronic substrate 102 via MOCVD, MBE, LPE, HVPE, and/or other suitable techniques.

Without being bound by theory, it is believed that by adjusting the operating conditions during deposition, the deposited first semiconductor material 108 may have desired crystal planes on its surface. For example, a first temperature (e.g., 1050° C.), a first pressure (e.g., 300 mbar), and a first growth time of 90 minutes can be used such that the N-type GaN material grows from the open regions 122 into the foundations 106 with a first triangular cross-section 111a having semi-polar planes with a Miller index of (11$\bar{2}$2). Then, a second temperature (e.g., 1160° C.), a second pressure (200 mbar), and a second growth time (e.g., 60 minutes) can be used such that the N-type GaN material may grow laterally over the foundations 106 to have a second generally trapezoidal cross-section 111b. In other examples, (a) the size, direction, material, and/or fill factor of the foundations 106, (b) the ambient conditions at the deposition site, (c) the impurities in the support material 103, and/or (d) other suitable operating conditions can be adjusted such that the first semiconductor material 108 can have other semi-polar planes at its surface.

Figure 4E:
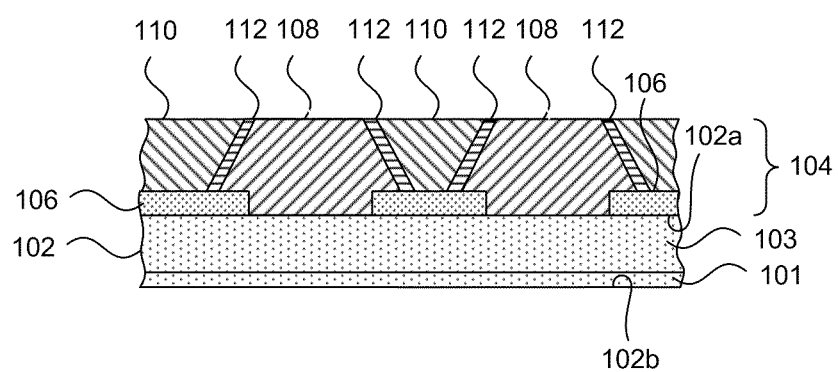

As shown in FIG. 4E, the process can include forming the LED structure 104 by forming the active region 112 and the second semiconductor material 110 in series on the semi-polar planes 120a and 120b of the first semiconductor material 108. In the illustrated embodiment, the active region 112 includes an InGaN/GaN MQW deposited on the first semiconductor material 108, and the second semiconductor material 110 includes a P-type GaN material (e.g., magnesium doped) deposited on the active region material. The active region 112 and second semiconductor material 110 can be deposited using MOCVD, MBE, LPE, HVPE, and/or other suitable techniques. In other embodiments, the process can also include forming a mirror layer (e.g., aluminum, not shown) and a support structure (e.g., a silicon and/or silicon oxide material, not shown) on the LED structure 104.

Figure 5A:
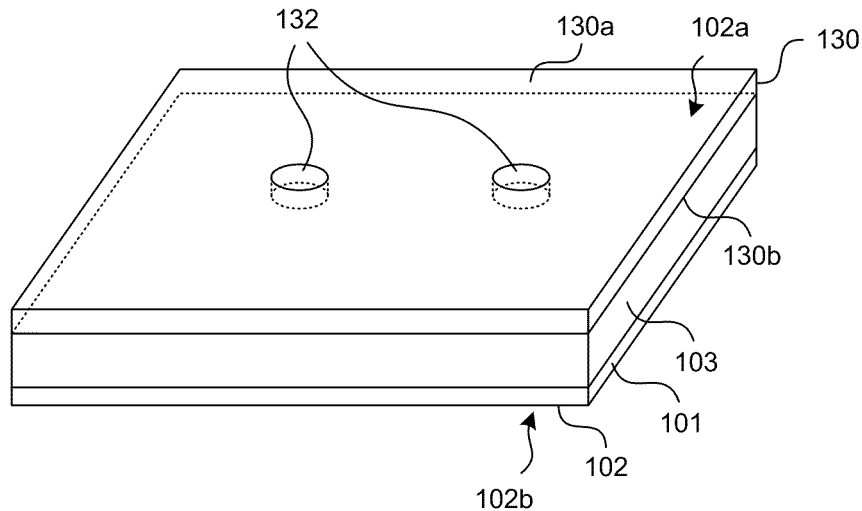
FIGS. 5A and 5B are perspective views of a portion of a microelectronic substrate undergoing a process of forming the SSL device in FIGS. 3A and 3C in accordance with embodiments of the technology.
Figure 5B:
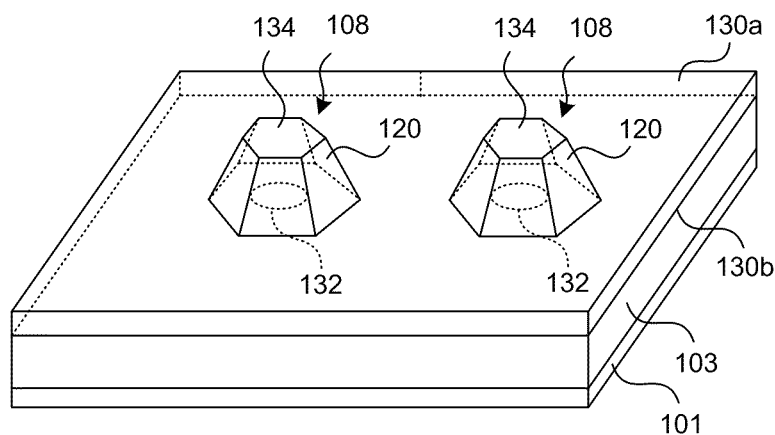

FIGS. 5A and 5B are perspective views of a portion of a microelectronic substrate 102 undergoing a process of forming the SSL device 100 in FIGS. 3A and 3C in accordance with embodiments of the technology. As shown in FIG. 5A, the process can include blanket depositing a foundation material 130 on the first surface 102a of the microelectronic substrate 102 (shown in FIG. 5A with the optional support material 103). In one embodiment, the foundation material 130 can include $SiO_2$ deposited via CVD, ALD, and/or other suitable techniques. The foundation material 130 has a first surface 130a and a second surface 130b in direct contact with the optional support material 103 and/or the microelectronic substrate 102. In other embodiments, the foundation material 130 can include $Al_2O_3$ and/or other suitable materials.

The process can include patterning the foundation material 130 using photolithography and/or other suitable techniques and removing a portion of the foundation material 130 to form a plurality of apertures 132. Two apertures 132 are shown in FIG. 5A for illustration purposes though any desired number of apertures 132 may be formed based on particular applications. In the illustrated embodiment, the apertures 132 are generally circular. In other embodiments, the apertures 132 may be polygonal, oval, and/or have other shapes.

As shown in FIG. 5B, the process can include forming the first semiconductor material 108 on the foundation material 130. Without being bound by theory, it is believed that by controlling the operating conditions during deposition, the formed first semiconductor material 108 may have six semipolar sidewalls 120 between a semiconductor surface 134 and the first surface 130a of the foundation material 130. The process can then include forming the active region 112 (FIG. 4E) and the second semiconductor material 110 (FIG. 4E) on the first semiconductor material 108 as discussed above with reference to FIG. 4E.

From the foregoing, it will be appreciated that specific embodiments of the technology have been described herein for purposes of illustration, but that various modifications may be made without deviating from the disclosure. Many of the elements of one embodiment may be combined with other embodiments in addition to or in lieu of the elements of the other embodiments. Accordingly, the disclosure is not limited except as by the appended claims.

We claim:

1. A light emitting diode, comprising:
   a support material;
   a semiconductor material connected to the support material, the semiconductor material having
      a bottom surface toward the support material,
      a top surface facing away from the support material,
      a sidewall extending along at least a portion of a semipolar crystal plane of the semiconductor material, and
      a slot extending through the semiconductor material from the top surface toward the support material;
   an active region in direct contact with the sidewall; and
   a conductive material within the slot.

2. The light emitting diode of claim 1 wherein the semiconductor material includes gallium nitride (GaN).

3. The light emitting diode of claim 1 wherein:
   the semiconductor material is a first semiconductor material;
   the light emitting diode further comprises a second semiconductor material connected to the support material, the second semiconductor material having
      a bottom surface facing toward the support material,
      a top surface facing away from the support material, and
      a sidewall extending along at least a portion of a semipolar crystal plane of the second semiconductor material;
   the sidewall of the second semiconductor material is at east generally parallel to the sidewall of the first semiconductor material; and
   the active region is between the sidewalls of the first and second semiconductor materials.

4. The light emitting diode of claim 3 wherein the top surface of the first semiconductor material and the top surface of the second semiconductor material are at least generally coplanar.

5. The light emitting diode of claim 3 wherein:
   the support material has a support surface facing toward the first and second semiconductor materials; and
   the top surface of the first semiconductor material and the top surface of the second semiconductor material are within a common plane at least generally parallel to the support surface.

6. The light emitting diode of claim 3 wherein:
   the support material has a support surface facing toward the first and second semiconductor materials; and
   the light emitting diode further comprises a foundation between the support surface and the active region.

7. The light emitting diode of claim 6 wherein:
   the first semiconductor material is directly connected to the support material at a first region of the support surface;
   the foundation is directly connected to the support material at a second region of the support surface; and
   the first and second regions of the support surface are adjacent to one another.

8. The light emitting diode of claim 7 wherein the conductive material is directly connected to the support material at the first region.

9. The light emitting diode of claim 3 wherein:
   the slot is a first slot;
   the conductive material is a first conductive material;
   the second semiconductor material includes a second slot extending through the second semiconductor material from the top surface of the second semiconductor material toward the support material; and
   the light emitting diode further comprises a second conductive material within the second slot.

10. The light emitting diode of claim 9 wherein:
    the first slot is at least generally parallel to a polar axis of the first semiconductor material; and
    the second slot is at least generally parallel to a polar axis of the second semiconductor material.

11. The light emitting diode of claim 9 wherein:
    the support material has a support surface facing toward the first and second semiconductor materials; and
    the light emitting diode further comprises a foundation between the support surface and the second semiconductor material.

12. The light emitting diode of claim 11 wherein:
    the first semiconductor material is directly connected to the support material at a first region of the support surface;
    the foundation is directly connected to the support material at a second region of the support surface; and
    the first and second regions of the support surface are adjacent to one another.

13. The light emitting diode of claim 12 wherein:
    the first conductive material is directly connected to the support material at the first region; and
    the second conductive material is directly connected to the foundation.

14. The light emitting diode of claim 1 wherein the semi-polar crystal plane has a Miller index of (10$\bar{1}$3).

15. The light emitting diode of claim 1 wherein the semi-polar crystal plane has a Miller index of (10$\bar{1}$1).

16. The light emitting diode of claim 1 wherein the semi-polar crystal plane has a Miller index of (11$\bar{2}$2).

17. The light emitting diode of claim 1, further comprising first and second foundations on the support material, wherein:
the first foundation is laterally spaced apart from the second foundation by an open region, and
the semiconductor material is at least partially within the open region.

18. The light emitting diode of claim 17 wherein the first foundation is between the active region and the support material.

19. A light emitting diode, comprising:
a support material having a support surface;
a semiconductor material on the support surface, the semiconductor material having
a semiconductor surface spaced apart from the support surface,
a semi-polar crystal plane a between the semiconductor surface and the support surface, and
a slot extending between the semiconductor surface and the support surface;
an active region in direct contact with the semi-polar crystal plane: and
a conductive material within the slot.

20. The light emitting diode of claim 19 wherein:
the semiconductor material includes a GaN material; and
the semi-polar crystal plane of the semiconductor material has a Miller index of (10$\bar{1}$3), (10$\bar{1}$1), or (11$\bar{2}$2).

21. The light emitting diode of claim 19 wherein:
the semiconductor material includes an N-type GaN material; and
the semi-polar crystal plane of the semiconductor material has a Miller index of (10$\bar{1}$3), (10$\bar{1}$1), or (11$\bar{2}$2).

22. The light emitting diode of claim 19 wherein:
the semiconductor material includes an N-type GaN material;
the semi-polar crystal plane of the semiconductor material has a Miller index of (10$\bar{1}$3), (10$\bar{1}$1), or (11$\bar{2}$2); and
the active region includes InGaN/GaN MQW in direct contact with the semi-polar plane of the N-type GaN material.

23. The light emitting diode of claim 19 wherein:
the semiconductor material includes an N-type GaN material having a plurality of gallium (Ga) and nitrogen (N) layers alternatively stacked along an axis;
the semi-polar crystal plane of the semiconductor material includes a plane canted relative to the axis; and
the active region includes InGaN/GaN MQW in direct contact with the semi-polar plane of the N-type GaN material.

24. The light emitting diode of claim 19 wherein:
the semiconductor material includes an N-type GaN material having a plurality of Ga and N layers alternately stacked along an axis;
the semi-polar crystal plane of the semiconductor material includes a plane that forms an angle with the axis, the angle being greater than 0° but less than 90°; and
the active region includes InGaN/GaN MQW in direct contact with the semi-polar plane of the N-type GaN material.

25. The light emitting diode of claim 19 wherein:
the semiconductor material includes an N-type GaN material having a plurality of Ga and N layers alternately stacked along an axis;
the semi-polar crystal plane is a first semi-polar plane that forms an angle with the axis, the angle being greater than 0° but less than 90°; and
the light emitting diode further includes second, third, fourth, fifth, and sixth semi-polar planes joined with one another and located between the semiconductor surface and the support surface of the support material, each of the second, third, fourth, fifth, and sixth semi-polar planes forms an angle that is greater than 0° but less than 90° relative to the axis.

26. The light emitting diode of claim 19 wherein:
the semiconductor material includes an N-type GaN material having a plurality of Ga and N layers alternately stacked along an axis;
the semi-polar crystal plane is a first semi-polar plane that forms an angle with the axis, the angle being greater than 0° but less than 90°;
the light emitting diode further includes second, third, fourth, fifth, and sixth semi-polar planes joined with one another and located between the semiconductor surface and the support surface of the support material, each of the second, third, fourth, fifth, and sixth semi-polar planes forms an angle that is greater than 0° but less than 90° relative to the axis; and
the active region includes InGaN/GaN multi quantum well (MQW) in direct contact with the first through sixth semi-polar planes of the N-type GaN material.

27. A light emitting diode, comprising:
a support material having a support surface;
a semiconductor material in direct contact with the support material, the semiconductor material extending along a direction generally parallel to a polar axis of the semiconductor material, the semiconductor material including an N-type GaN material having
first and second sidewalls extending away from the support surface, the first and second sidewalls including semi-polar crystal planes of the N-type GaN material with Miller indices of (11$\bar{2}$2) and (10$\bar{1}$1), respectively,
a first semiconductor surface spaced apart from the support surface, the first semiconductor surface being at least generally planar;
a first slot extending between the first semiconductor surface and the support surface;
an active region in direct contact with the semiconductor material, the active region forming an angle of about 32° relative to the polar axis of the semiconductor material, the active region including an InGaN/GaN MQW;
first and second foundations on the support surface, the first foundation being laterally spaced apart from the second foundation by an open region, the first and second foundations individually having an at least generally cuboid shape, the N-type GaN material being at least partially within the open region;
a P-type GaN material spaced laterally apart from the N-type GaN material, the P-type GaN material having
a second semiconductor surface spaced apart from the support surface, the second semiconductor surface being at least generally planar; and
a second slot extending between the second semiconductor surface and the support surface;
a first contact in the first slot of the N-type GaN material; and
a second contact in the second slot of the P-type GaN material.

28. A light emitting diode, comprising:
a support material having a support surface;
a semiconductor material in direct contact with the support material, the semiconductor material having
an N-type GaN material,
a polar axis, the semiconductor material extending from the support material along a direction generally parallel to the polar axis,
first and second sidewalls extending away from the support surface, the first and second sidewalls including semi-polar crystal planes with Miller indices of (11$\bar{2}$2) and (10$\bar{1}$1), respectively,
a top surface spaced apart from the support surface, and
a slot extending between the top surface and the support surface;
an active region in direct contact with the semiconductor material, the active region forming an angle greater than 0° and less than 90° relative to the polar axis; and
a conductive material within the slot.

* * * * *

UNITED STATES PATENT AND TRADEMARK OFFICE
CERTIFICATE OF CORRECTION

PATENT NO. : 8,445,890 B2  
APPLICATION NO. : 12/720440  
DATED : May 21, 2013  
INVENTOR(S) : Lifang Xu et al.

Page 1 of 1

It is certified that error appears in the above-identified patent and that said Letters Patent is hereby corrected as shown below:

In the Claims:

In column 7, line 50, in Claim 1, after "surface" insert -- facing --.

In column 8, line 4, in Claim 3, delete "east" and insert -- least --, therefor.

In column 9, line 23, in Claim 19, delete "a" and insert -- extending --, therefor.

In column 9, line 34, in Claim 20, delete " $or(11\bar{2}2).$ " and insert -- $or\ (11\bar{2}2).$ --, therefor.

In column 9, line 39, in Claim 21, delete " $or(11\bar{2}2).$ " and insert -- $or\ (11\bar{2}2).$ --, therefor.

In column 9, line 64, in Claim 24, delete "90° ;" and insert -- 90°; --, therefor.

In column 10, line 7, in Claim 25, delete "90° ;" and insert -- 90°; --, therefor.

In column 10, line 20, in Claim 26, delete "90° ;" and insert -- 90°; --, therefor.

Signed and Sealed this  
Sixteenth Day of July, 2013

Teresa Stanek Rea  
*Acting Director of the United States Patent and Trademark Office*